(12) United States Patent
Chiu

(10) Patent No.: US 7,932,997 B2
(45) Date of Patent: Apr. 26, 2011

(54) RECONFIGURABLE MASK METHOD AND DEVICE USING MEMS FOR MANUFACTURING INTEGRATED CIRCUITS

(75) Inventor: Tzu Yin Chiu, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 647 days.

(21) Appl. No.: 11/537,655

(22) Filed: Oct. 1, 2006

(65) Prior Publication Data

US 2007/0103664 A1    May 10, 2007

(30) Foreign Application Priority Data

Nov. 7, 2005    (CN) .......................... 2005 1 0110313

(51) Int. Cl.
*G03B 27/54*    (2006.01)
*G03B 27/42*    (2006.01)
(52) U.S. Cl. .......................................... 355/67; 355/53
(58) Field of Classification Search .................. 355/53, 355/67–71, 77; 359/291, 292; 430/5, 20, 430/30; 250/492.2, 492.22
See application file for complete search history.

(56) References Cited

U.S. PATENT DOCUMENTS

| 4,317,611 A | | 3/1982 | Petersen |
| 5,870,176 A | | 2/1999 | Sweatt et al. |
| 5,900,637 A | * | 5/1999 | Smith ...................... 250/492.22 |
| 5,989,752 A | | 11/1999 | Chiu |
| 6,618,185 B2 | * | 9/2003 | Sandstrom .................... 359/292 |
| 6,936,385 B2 | * | 8/2005 | Lof et al. ......................... 430/22 |
| 7,189,498 B2 | | 3/2007 | Eib et al. |
| 7,215,409 B2 | * | 5/2007 | Sandstrom ...................... 355/53 |

* cited by examiner

*Primary Examiner* — Hung Henry Nguyen
(74) *Attorney, Agent, or Firm* — Kilpatrick Townsend and Stockton LLP

(57) ABSTRACT

A method for illuminating an object for selectively patterning a photosensitive material overlying the object using an array of mirror devices. The method includes applying electromagnetic radiation using a flood beam onto an array of mirror devices. Each of the mirror devices is associated with a pixel for a pattern to be exposed onto the photosensitive material. The method also includes selectively actuating one or more mirrors on the array to deflect corresponding portions of the beam onto corresponding portions of the photosensitive material to expose the portions of the photosensitive material on the object. The method maintains one or more other mirrors in a selected position(s) to maintain corresponding other portions of the photosensitive material free from exposure. Preferably, the combination of exposed and unexposed portions forms the pattern exposed onto the photosensitive material.

15 Claims, 8 Drawing Sheets

RECONFIGURABLE MASK METHOD AND DEVICE USING MEMS FOR MANUFACTURING INTEGRATED CIRCUITS

CROSS-REFERENCES TO RELATED APPLICATIONS

This application claims priority to Chinese Application No. 200510110313.3; filed on Nov. 7, 2005; commonly assigned, and of which is hereby incorporated by reference for all purposes.

BACKGROUND OF THE INVENTION

The present invention is directed to integrated circuits and their processing for the manufacture of semiconductor devices. More particularly, the invention provides a method and device for manufacturing a photolithography mask for the manufacture of integrated circuits. Merely by way of example, the invention has been applied to one or more masks for the manufacture of integrated circuits. But it would be recognized that the invention has a much broader range of applicability. For example, the invention can be applied to photosensitive material on the wafer itself, or other substrate object that requires exposure to light for patterning photosensitive material.

Integrated circuits or "ICs" have evolved from a handful of interconnected devices fabricated on a single chip of silicon to millions of devices. Current ICs provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of ICs. Semiconductor devices are now being fabricated with features less than a quarter of a micron across.

Increasing circuit density has not only improved the complexity and performance of ICs but has also provided lower cost parts to the consumer. An IC fabrication facility can cost hundreds of millions, or even billions, of dollars. Each fabrication facility will have a certain throughput of wafers, and each wafer will have a certain number of ICs on it. Therefore, by making the individual devices of an IC smaller, more devices may be fabricated on each wafer, thus increasing the output of the fabrication facility. Making devices smaller is very challenging, as each process used in IC fabrication has a limit. That is to say, a given process typically only works down to a certain feature size, and then either the process or the device layout needs to be changed. An example of such a limit is the ability to procure mask sets used for the manufacture of integrated circuits in a cost effective and efficient way.

Fabrication of custom integrated circuits using chip foundry services has evolved over the years. Fabless chip companies often design the custom integrated circuits. Such custom integrated circuits require a set of custom masks commonly called "reticles" to be manufactured. A chip foundry company called Semiconductor International Manufacturing Company (SMIC) of Shanghai, China is an example of a chip company that performs foundry services. Although fabless chip companies and foundry services have increased through the years, many limitations still exist. For example, mask sets used for the manufacture of the custom integrated circuits are often expensive. That is, they can cost hundreds of thousands of U.S. dollars and take along lead-time to make. Additionally, there are a limited amount of mask shops that manufacture masks, also leading to difficulty in procuring the mask sets for the custom integrated circuits. These and other limitations are described throughout the present specification and more particularly below.

From the above, it is seen that an improved technique for processing semiconductor devices is desired.

BRIEF SUMMARY OF THE INVENTION

According to the present invention, techniques including methods for the manufacture of semiconductor devices are provided. More particularly, the invention provides a method and MEMS ("micro electrical mechanical system") device for manufacturing a photolithography mask for the manufacture of integrated circuits. Merely by way of example, the invention has been applied to one or more masks for the manufacture of integrated circuits. But it would be recognized that the invention has a much broader range of applicability. For example, the invention can be applied to photosensitive material on the wafer itself, or other substrate object that requires exposure to light for patterning photosensitive material.

In a specific embodiment, the invention provides a method for illuminating an object for selectively patterning a photosensitive material overlying the object using an array of mirror devices. The method includes applying electromagnetic radiation using a flood beam onto an array of mirror devices. Each of the mirror devices is associated with a pixel for a pattern to be exposed onto the photosensitive material. The method also includes selectively actuating one or more mirrors on the array to deflect corresponding portions of the beam onto corresponding portions of the photosensitive material to expose the portions of the photosensitive material on the object. The method maintains one or more other mirrors in a selected position(s) to maintain corresponding other portions of the photosensitive material free from exposure. Preferably, the combination of exposed and unexposed portions forms the pattern exposed onto the photosensitive material.

Preferably, the method includes retrieving one or more outputs associated with patterns, which are stored in memory. Before actuating the one or more mirrors, the method retrieves an electronic file from memory coupled to a computer. The file includes information associated with the pattern to be exposed onto the photosensitive material. The method reads the information in the file and determines outputs associated with the selected one or more mirrors to be actuated. Depending upon the embodiment, there can be other variations, modifications, and alternatives.

In alternative embodiments, the method adjusts a relative spatial distance between the array of mirrors and the photosensitive material for a predetermined period of time to shift a phase associated with at least one of the mirrors. Preferably, the object is moved relative to the array of mirrors. Alternatively, the array of mirrors is moved relative to the object.

In still a further embodiment, the invention provides an apparatus for illuminating an object for selectively patterning a photosensitive material overlying the object using an array of mirror devices. The apparatus has an array of mirror devices. Each of the mirror devices is capable of actuating from at least a first state to a second state. Preferably, each of the mirror devices is associated with a pixel for a pattern to be exposed onto a photosensitive material. The apparatus also includes an electromagnetic radiation source coupled to the array of mirror devices. The electromagnetic radiation source is adapted to apply electromagnetic radiation using a flood beam onto the array of mirror devices. A drive device is coupled to the array of mirror devices. The drive device is adapted to selectively actuate one or more mirrors on the array to deflect a portion of the beam onto a portion of the photosensitive material to expose the portion of the photosensitive material. The drive device is also adapted to maintain one or more other mirrors in a selected position to maintain other another portion of the photosensitive material free from exposure. Preferably, the apparatus also has a memory and a processor coupled to the drive device.

In an alternative embodiment, the invention includes a method for illuminating an object for selectively patterning a photosensitive material overlying the object using an array of mirror devices. The method includes reflecting a first beam having a first wavelength from a surface of a first mirror device in an array of mirror devices and reflecting a second beam having a second wavelength from a surface of a second mirror device in the array of mirror devices. The first beam is combined with the second beam in a manner to form a resulting beam having a third wavelength. The third wavelength is smaller than both the first wavelength and the second wavelength. The method includes exposing a portion of photosensitive material overlying an object with the resulting beam having the third wavelength.

Still further, the invention includes an alternative method for illuminating an object for selectively patterning a photosensitive material overlying the object. The method includes reflecting a first beam having a first intensity from a surface of a first mirror device and reflecting a second beam having a second intensity from a surface of a second mirror device. The method combines the first beam with the second beam in a manner to form a resulting beam having a third intensity, which is either smaller or larger than either the first intensity or the second intensity. Alternatively, the method combines the beams before reflecting them from the mirror surfaces. The method exposes a portion of photosensitive material overlying an object with the resulting beam having the third intensity.

Many benefits are achieved by way of the present invention over conventional techniques. For example, the present technique provides an easy to use process that relies upon conventional technology. In some embodiments, the method provides higher device yields in dies per wafer. Additionally, the method provides a process that is compatible with conventional process technology without substantial modifications to conventional equipment and processes. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

DETAILED DESCRIPTION OF THE INVENTION

According to the present invention, techniques including methods and resulting structures for the manufacture of semiconductor devices are provided. More particularly, the invention provides a method and device for manufacturing a photolithography mask for the manufacture of integrated circuits. Merely by way of example, the invention has been applied to one or more masks for the manufacture of integrated circuits. But it would be recognized that the invention has a much broader range of applicability. For example, the invention can be applied to photosensitive material on the wafer itself, or other substrate object that requires exposure to light for patterning photosensitive material.

Figure 1:
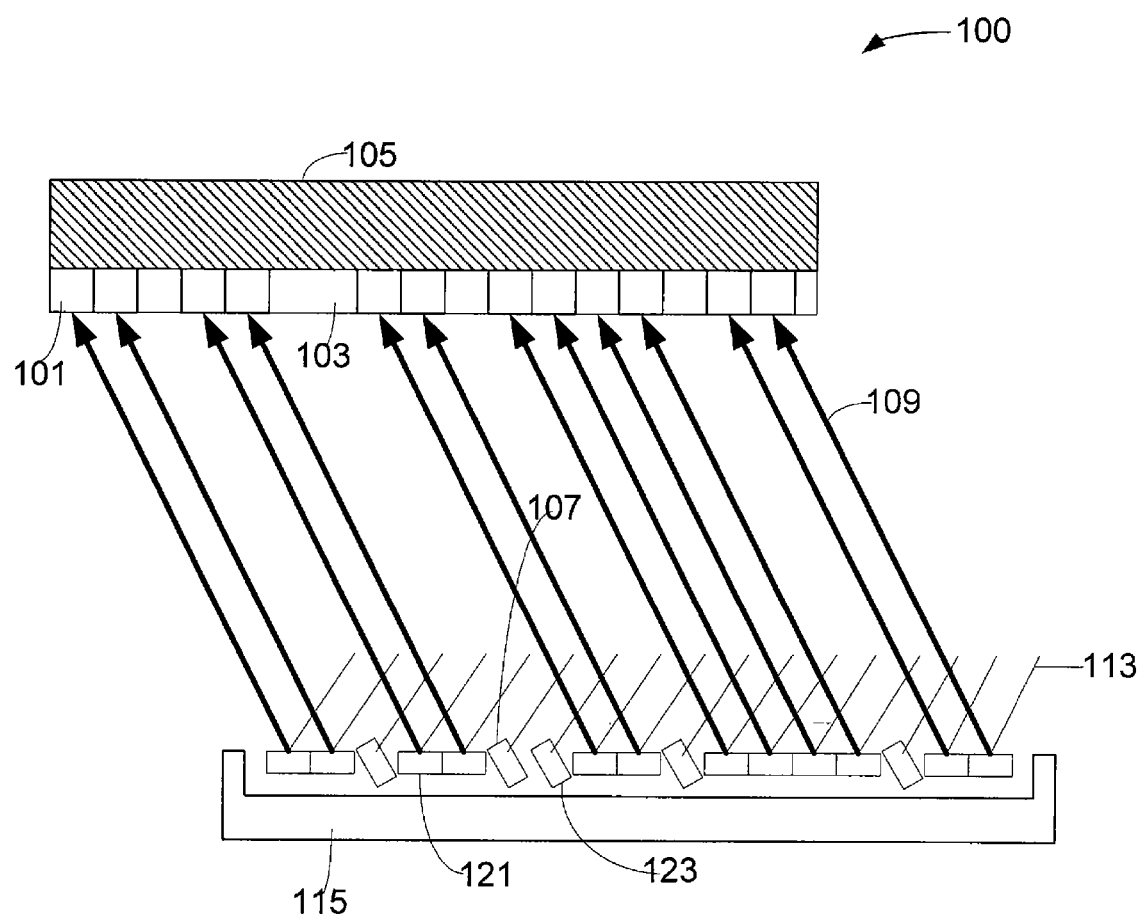
FIG. 1 is a simplified side-view diagram of a MEMS optical apparatus according to an embodiment of the present invention.

FIG. 1 is a simplified side-view diagram of a MEMS optical illumination apparatus 100 according to an embodiment of the present invention. This diagram is merely an example, which should not unduly limit the scope of the claims herein. One of ordinary skill in the art would recognize many variations, alternatives, and modifications. As shown, the apparatus 100 is illuminating an object 105 for selectively patterning a photosensitive material 101 overlying the object using an array of mirror devices 115. The objects include any suitable device such as semiconductor wafers, glass substrates, composite materials, etc. The apparatus has an array of mirror devices 121, 107, 123. Although each of the devices is illustrated in a specific geometric configuration, there can be others, e.g., square, oval. Each of the mirror devices is capable of actuating from at least a first state 121 to a second state 107. The first state 121 can be an on state and the second state 107 can be an off state. The first state exposes the photosensitive material 101, as shown. The second state 103 keeps the photosensitive material from exposure and often reflects the illumination to a region outside the surface of the photosensitive material. Preferably, each of the mirror devices is associated with a pixel (e.g., 101) for a pattern to be exposed onto a photosensitive material. Preferably, the photosensitive material is a photoresist material, including positive and/or negative resists. Alternatively, certain regions 103 are not exposed based upon the state of the mirror devices.

The apparatus also includes an electromagnetic radiation source 113 coupled to the array of mirror devices. The electromagnetic radiation source can be a lamp of a suitable energy and wavelength, but can be others. The electromagnetic radiation source is adapted to apply electromagnetic radiation using a flood beam onto the array of mirror devices. Alternatively, the source can be pulsed or a combination of flood and pulse, depending upon the embodiment. As shown, selected mirror devices are actuated to illuminate 109 selected regions of the photosensitive material. Of course, one of ordinary skill in the art would recognize many variations, modifications, and alternatives.

A drive device (not shown) is coupled to the array of mirror devices. The drive device is adapted to selectively actuate one or more mirrors on the array to deflect a portion of the beam onto a portion of the photosensitive material to expose the portion of the photosensitive material. The drive device is also adapted to maintain one or more other mirrors in a selected position to maintain other another portion of the photosensitive material free from exposure. Preferably, the apparatus also has a memory and a processor coupled to the drive device. Further details of the apparatus are provided throughout the present specification and more particularly below.

Figure 2:
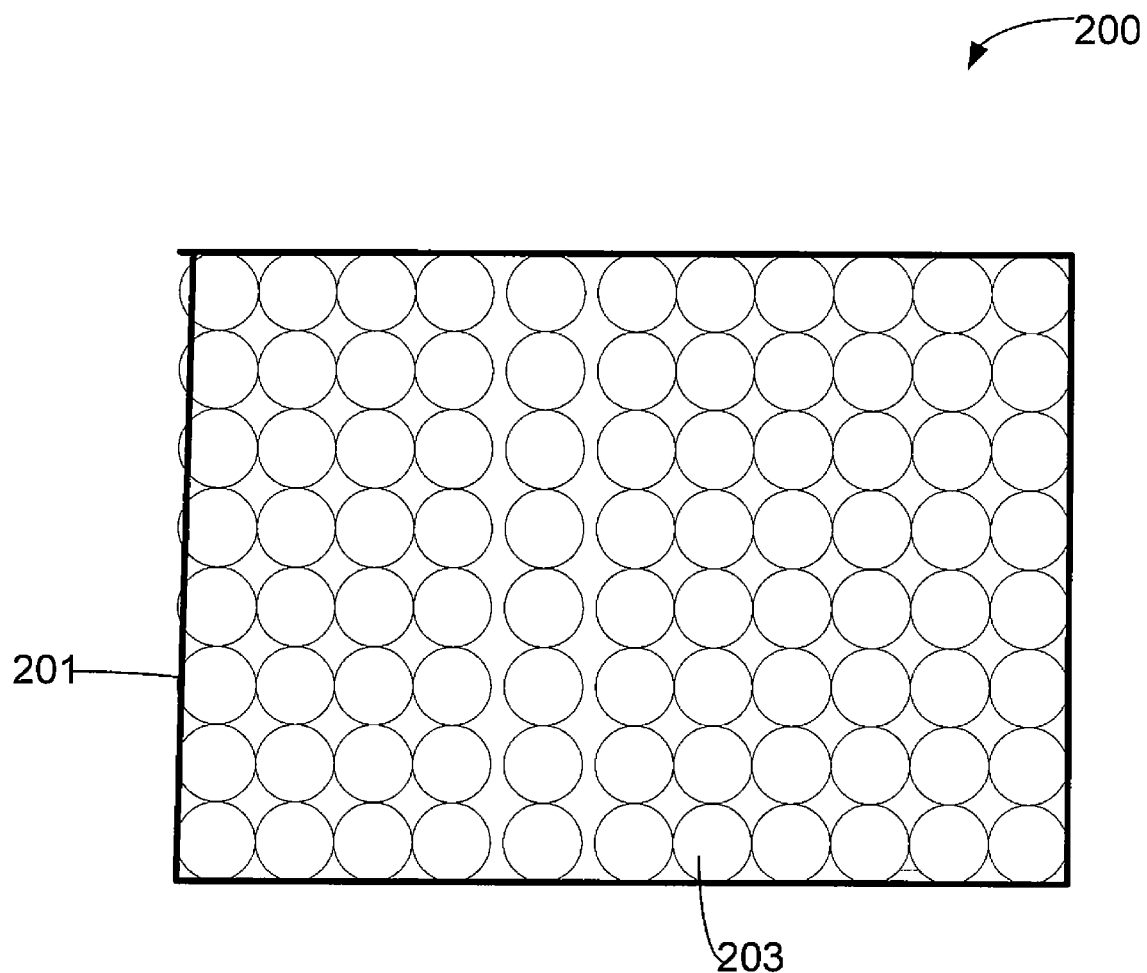
FIG. 2 is a simplified top-view diagram of a MEMS array according to an embodiment of the present invention.

FIG. 2 is a simplified top-view diagram 200 of a MEMS array according to an embodiment of the present invention. This diagram is merely an example, which should not unduly limit the scope of the claims herein. One of ordinary skill in the art would recognize many variations, alternatives, and modifications. As shown, the array 201 includes individual mirror elements. Each of the mirror elements 203 corresponds to a pixel element. A combination of such pixel elements corresponds to a larger pattern according to a specific embodiment. Each of the mirror devices directs a beam having a spot size of a predetermined size (e.g., 0.1 microns, 0.4 microns), which defines the pixel size of the pattern. The present array is implemented in the apparatus described below, but can also be implemented in other apparatus.

Figure 3:
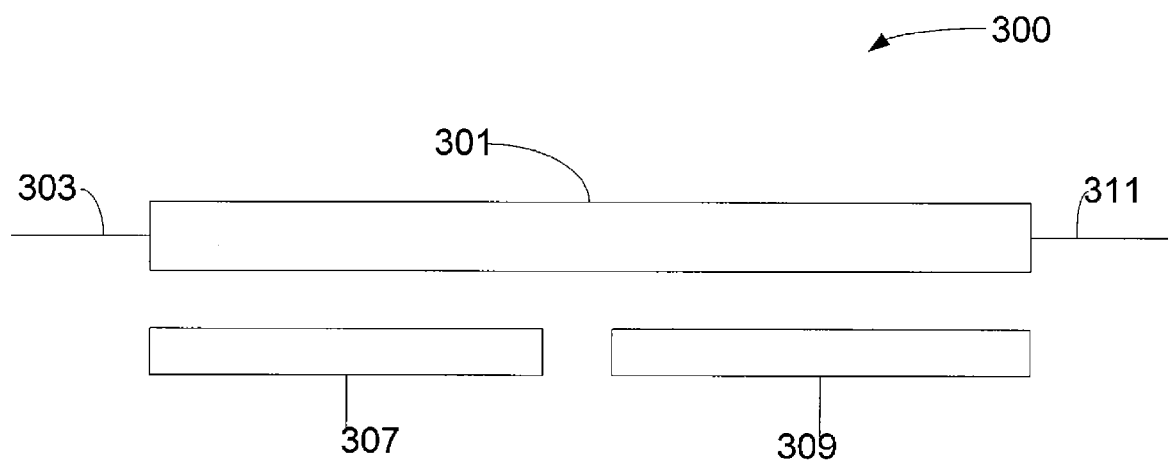
FIG. 3 is a simplified side-view diagram of a MEMS device according to an embodiment of the present invention.

FIG. 3 is a simplified side-view diagram of a MEMS device 300 according to an embodiment of the present invention. This diagram is merely an example, which should not unduly limit the scope of the claims herein. One of ordinary skill in the art would recognize many variations, alternatives, and modifications. As shown, the MEMS device 300 includes a mirror element 301, which is supported by a pair of torsion bars 311 and 303. The torsion bars give while the mirror element is pulled via electrostatic force. Such electrostatic force derives from either or both electrode devices 307, 309, which are provided underlying the mirror element 301. Each mirror device has a dimension of about hundreds (e.g., 300, 100) of microns or tens of microns and less, but the dimension depends upon the application. Other examples of such a mirror device can be found in U.S. Pat. No. 4,317,611, titled Optical Deflection Device, in the name of Kurt E. Petersen, and assigned to IBM Corporation, but should not be limiting.

Preferably, the mirror device can actuate from at least a first state to a second state. The first state corresponds to an on state and the second state corresponds to an off state. Preferably, the mirror has a tolerance of about a predetermined limit but should not drift. The mirror can also use other drive devices. Such alternative drive devices include piezo electric, electrostatic, and others, depending upon the application. Of course, one of ordinary skill in the art would recognize many variations, alternatives, and variations. Further details of the invention are found throughout the present specification and more particularly below.

Figure 4:
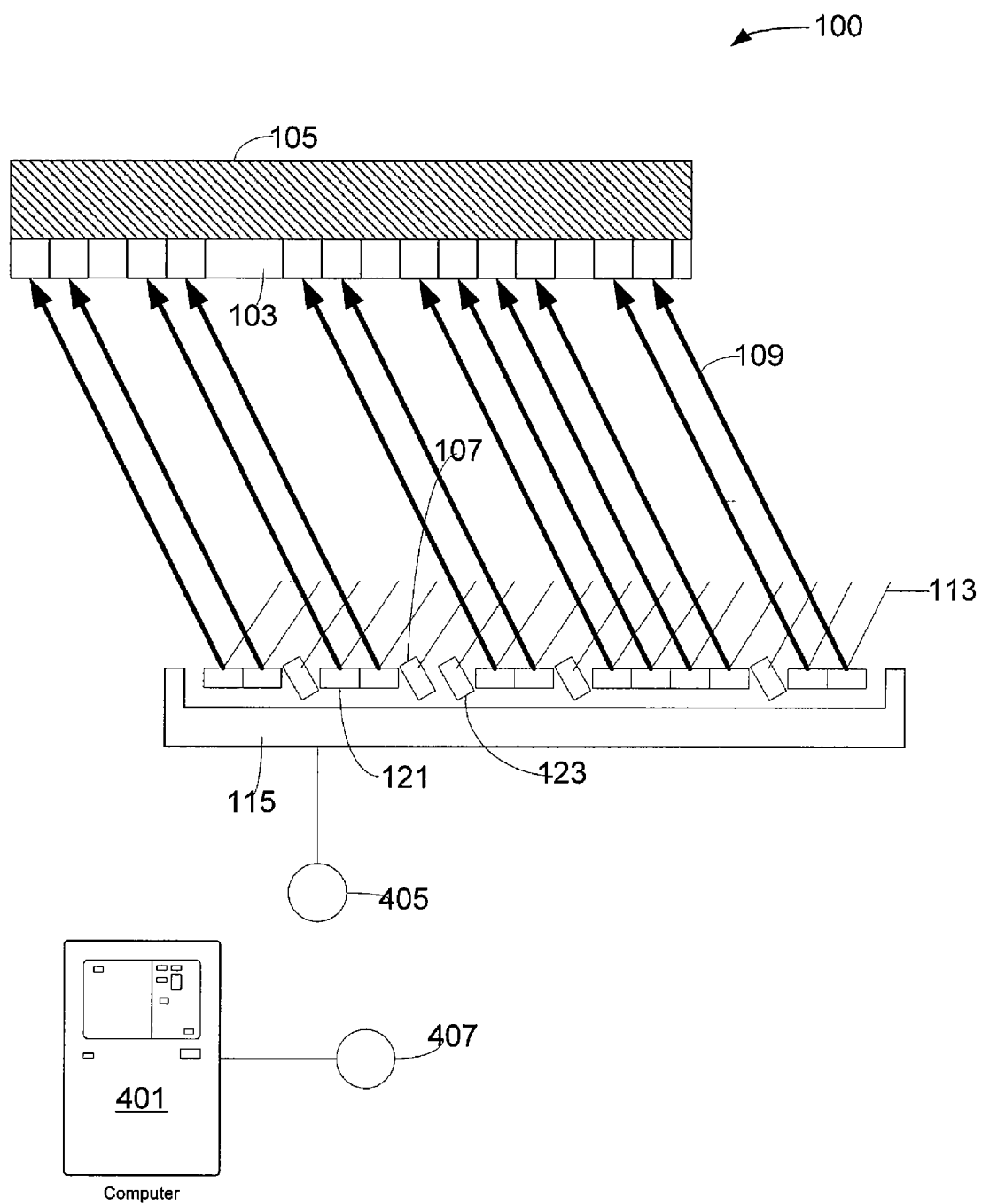
FIG. 4 is a simplified side-view diagram of an optical system including the MEMS apparatus according to an embodiment of the present system.

FIG. 4 is a simplified side-view diagram of an optical system 400 including the apparatus according to an embodiment of the present system. This diagram is merely an example, which should not unduly limit the scope of the claims herein. One of ordinary skill in the art would recognize many variations, alternatives, and modifications. Like reference numerals are used in this figure as certain other figures herein. Such numbers are not intended to be limiting, however. As shown, the apparatus 100 is illuminating object 105 for selectively patterning a photosensitive material 101 overlying the object using the array of mirror devices 115. The objects include any suitable device such as semiconductor wafers, glass substrates, composite member, laminated structures, and the like. As noted, the apparatus has the array of mirror devices 121, 107, 123. Each of the mirror devices is capable of actuating from at least a first state 121 to a second state 107. The first state 121 can be an on state and the second state 107 can be an off state. The first state exposes the photosensitive material 101, as shown. The second state 103 keeps the photosensitive material from exposure and often reflects the illumination to a region outside the surface of the photosensitive material. Preferably, each of the mirror devices is associated with a pixel (e.g., 101) for a pattern to be exposed onto a photosensitive material. Preferably, the photosensitive material is the photoresist material, including positive and/or negative resists. Alternatively, certain regions 103 are not exposed based upon the state of the mirror devices.

Additionally, the apparatus also includes electromagnetic radiation source 113 coupled to the array of mirror devices. The electromagnetic radiation source can be a lamp having a collimated beam. The lamp can also be a laser source. The electromagnetic radiation source is adapted to apply electromagnetic radiation using a flood beam onto the array of mirror devices. Alternatively, the source can be pulsed or a combination of flood and pulse, depending upon the embodiment. As shown, selected mirror devices are actuated to illuminate 109 selected regions of the photosensitive material. Of course, one of ordinary skill in the art would recognize many variations, modifications, and alternatives.

As illustrated in FIG. 3, the drive device is coupled to each of the mirror devices in the array of mirror devices. The drive device is adapted to selectively actuate one or more mirrors on the array to deflect a portion of the beam onto a portion of the photosensitive material to expose the portion of the photosensitive material. The drive device is also adapted to maintain one or more other mirrors in a selected position to maintain other another portion of the photosensitive material free from exposure.

The apparatus also includes an optical lens coupled between the array and the object. The lens can be a single lens or multiple lens. The lens can also be applied individually to each of the fiber ends. The lens can be a reduction lens, e.g., 10:1, 5:1, 4:1. Depending upon the embodiment, there can be many other variations, modifications, and alternatives. Preferably, the apparatus also has a memory and a processor coupled to the drive device, which will be described in more detail below.

Preferably, the system also includes computing apparatus 401 coupled to interface 407. The interface provides outputs to selectively actuate the mirror devices in the array. Additionally, the interface may also include inputs from the mirror devices in the array. Such inputs could include control information and the like. Additionally, the mirror devices in the array include interface 405, which couples to computer interface 407. The computing apparatus includes display device, display screen, cabinet, keyboard, scanner and mouse. The mouse and keyboard are representative "user input devices." The mouse includes buttons for selection of buttons on a graphical user interface device. Other examples of user input devices are a touch screen, light pen, track ball, data glove, microphone, and so forth. In a preferred embodiment, the computer includes a Pentium™ class based computer, running Windows™ NT or XP operating system by Microsoft Corporation. However, the system is easily adapted to other operating systems and architectures by those of ordinary skill in the art without departing from the scope of the present invention. The apparatus includes computer components such as disk drives, a processor, storage device, etc. The storage devices include, but are not limited to, disk drives, magnetic tape, solid-state memory, bubble memory, etc. Additional hardware such as input/output (I/O) interface cards for connecting computer apparatus to external devices external storage, other computers or additional peripherals, is also included.

Other arrangements of subsystems and interconnections are readily achievable by those of ordinary skill in the art. System memory, and the fixed disk are examples of tangible media for storage of computer programs, other types of tangible media include floppy disks, removable hard disks, optical storage media such as CD-ROMS and bar codes, and semiconductor memories such as flash memory, read-only-memories (ROM), and battery backed memory. Although the above has been illustrated in terms of specific hardware features, it would be recognized that many variations, alternatives, and modifications exist. For example, any of the hardware features can be further combined, or even separated. The features can also be implemented, in part, through software or a combination of hardware and software. The hardware and software can be further integrated or less integrated depending upon the application.

Figure 5:
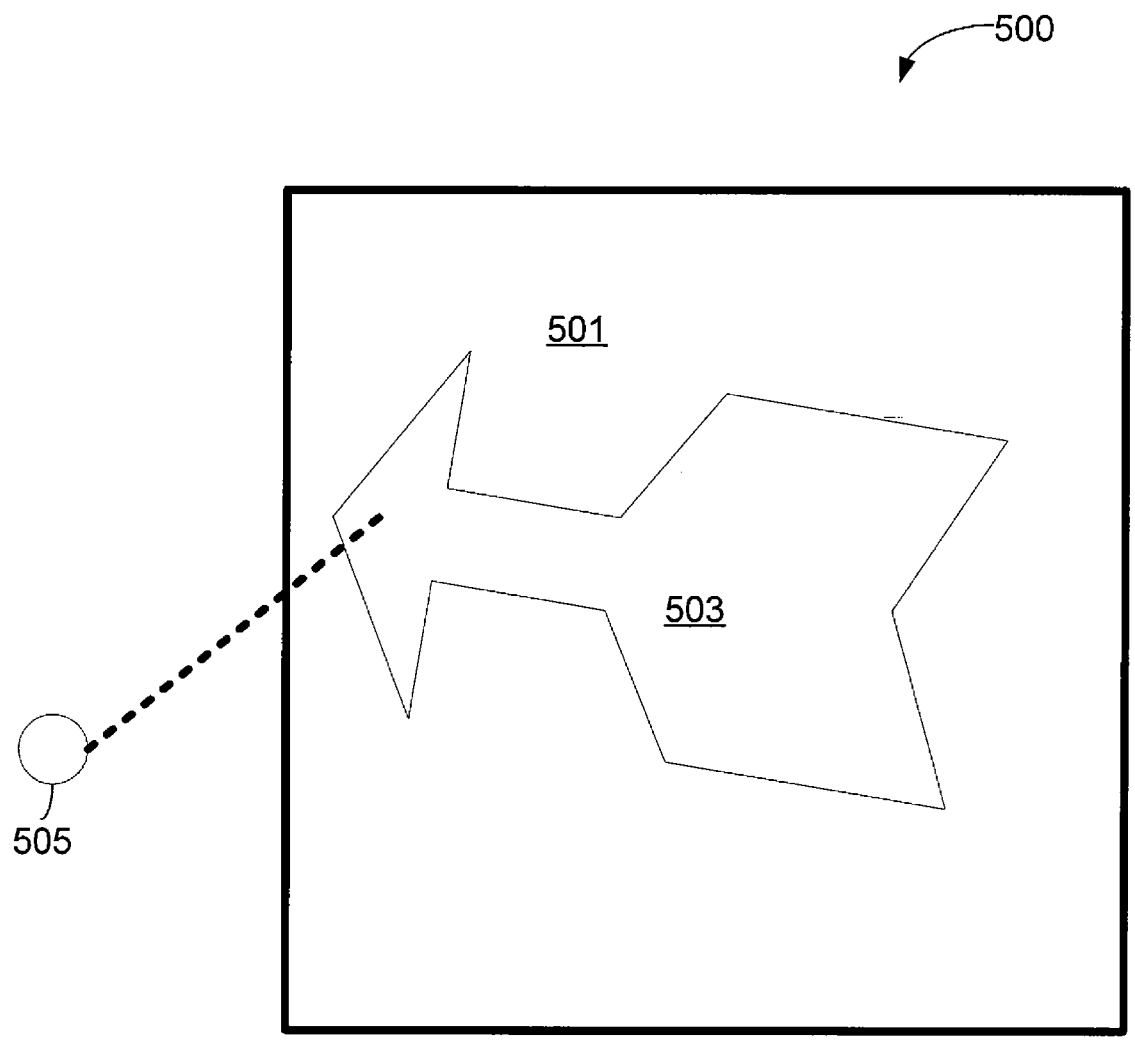
FIG. 5 is a simplified top-view diagram of a pattern printed using a method according to an embodiment of the present invention.

FIG. 5 is a simplified top-view diagram 500 of a pattern 503 printed using a method according to an embodiment of the present invention. This diagram is merely an example, which should not unduly limit the scope of the claims herein. One of ordinary skill in the art would recognize many variations, alternatives, and modifications. As shown, the pattern 503 has been printed onto background 501, which was not exposed according to a specific embodiment. The pattern is composed of pixel element 505, which correspond to each of the mirror elements. Depending upon the embodiment, there can be other patterns, which are stored in memory in the computer apparatus. Such patterns can be retrieved, processed, where outputs for each of the pixel elements are determined.

A method according to an embodiment of the present invention can be briefly provided as follows:

1. Provide an object, e.g., semiconductor wafer, having an overlying layer of photosensitive material;
2. Select a file from memory associated with a pattern to be printed onto the object;
3. Process the file;
4. Determine output based upon the file;
5. Apply electromagnetic radiation using a flood beam onto an array of mirror devices;
6. Selectively actuate based upon the output one or more mirrors on the array to deflect corresponding portions of the beam onto corresponding portions of the photosensitive material to expose the portions of the photosensitive material on the object;
7. Maintain one or more other mirrors in a selected position(s) to maintain corresponding other portions of the photosensitive material free from exposure;
8. Develop exposed (or unexposed) portions of the photosensitive material to form a patterned film;
9. Process the object including the patterned film;
10. Strip the patterned film; and
11. Perform other steps, as desired.

The above sequence of steps provides a method according to an embodiment of the present invention. Other alternatives can also be provided where steps are added, one or more steps are removed, or one or more steps are provided in a different sequence without departing from the scope of the claims herein. The present method uses MEMS devices to selectively expose one or more portions of photosensitive material for exposure. Further details of the present method can be found throughout the present specification and more particularly below.

Figure 6:
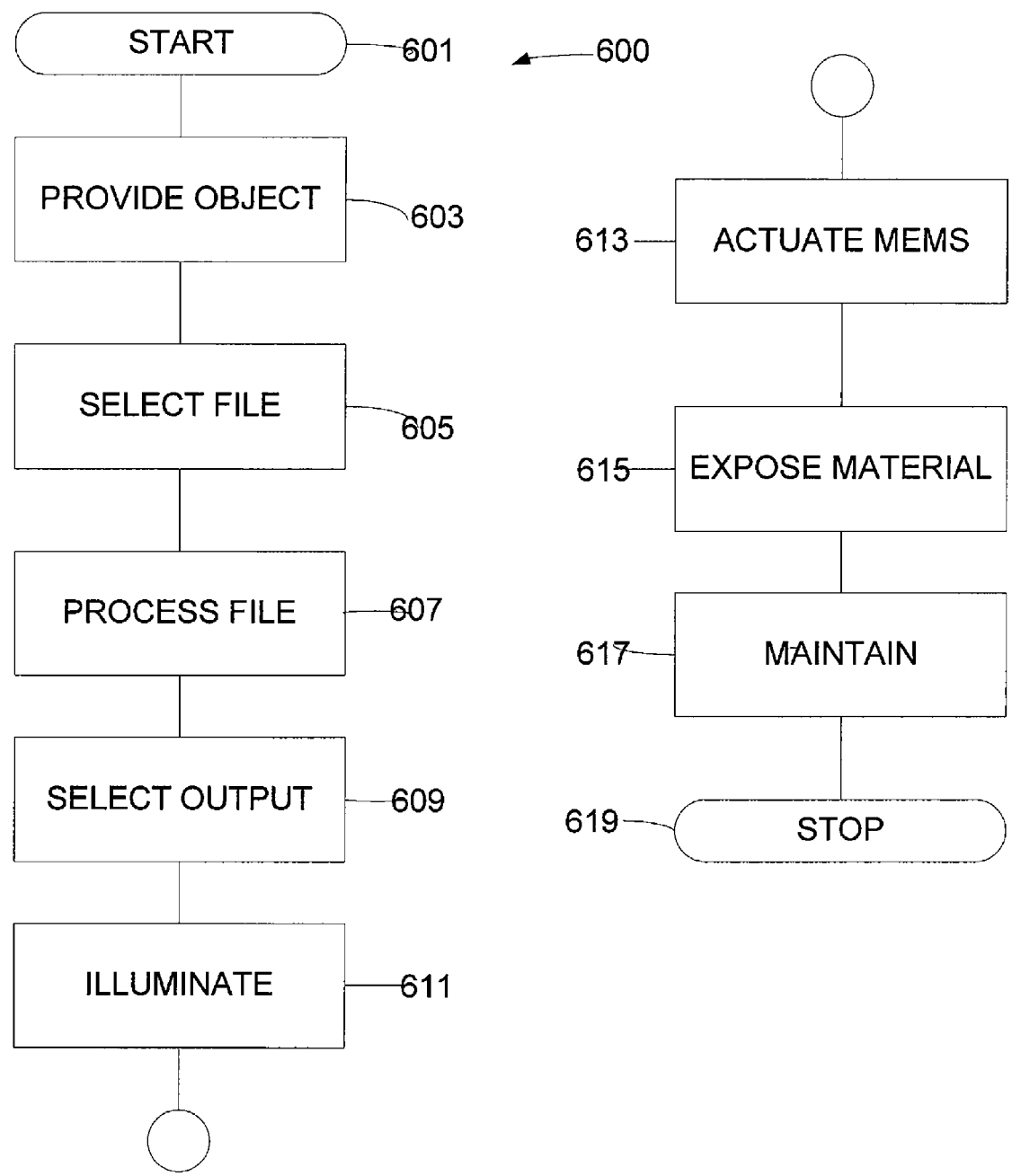
FIG. 6 is a simplified side-view diagram illustrating an optical patterning method according to an embodiment of the present invention.

FIG. 6 is a simplified side-view diagram illustrating an optical patterning method 600 according to an embodiment of the present invention. This diagram is merely an example, which should not unduly limit the scope of the claims herein. One of ordinary skill in the art would recognize many variations, alternatives, and modifications. As shown, the method begins with start, step 601. The method provides an object (step 603), e.g., semiconductor wafer, glass plate, having an overlying layer of photosensitive material. The method selects (step 605) an electronic file from memory associated with a pattern to be printed onto the object. The electronic file can be one or a plurality of files stored in memory.

The method processes (step 607) the file using at least a microprocessing device. Preferably, the method determines selected outputs (step 609) based upon the file to form the pattern. The method provides the outputs to selected devices in the mirror array. Electromagnetic radiation using a flood beam is illuminated (step 611) onto an array of mirror devices. The method selectively actuates (step 613) one or more mirrors on the array based upon the outputs to deflect corresponding portions of the beam onto corresponding portions of the photosensitive material. Such portions of the photosensitive material are exposed (step 615) on the object.

The method maintains (step 617) one or more other mirrors in a selected position(s) to maintain corresponding other portions of the photosensitive material free from exposure. The method develops exposed (or unexposed) portions of the photosensitive material to form a patterned film and processes the object including the patterned film. Eventually, the patterned film may be stripped using an ashing or stripping process. Of course, the sequence of steps depends upon the application.

The above sequence of steps provides a method according to an embodiment of the present invention. Other alternatives can also be provided where steps are added, one or more steps are removed, or one or more steps are provided in a different sequence without departing from the scope of the claims herein. The present method uses MEMS devices to selectively expose one or more portions of photosensitive material for exposure. Further methods according to the present invention are described throughout the present specification and more particularly below.

Figure 7:
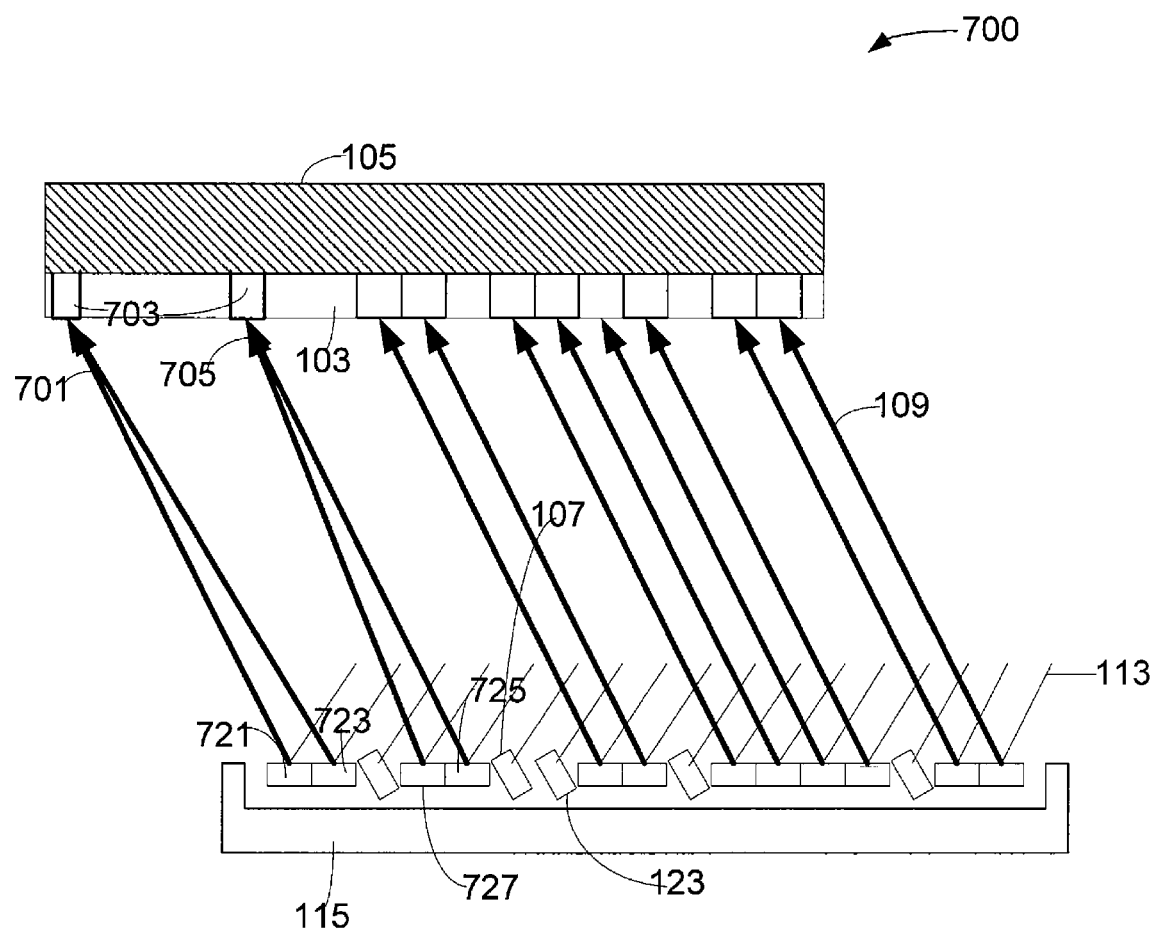
FIG. 7 is a simplified side-view diagram illustrating an optical patterning method according to an alternative embodiment of the present invention.

FIG. 7 is a simplified side-view diagram illustrating an optical patterning method according to an alternative embodiment of the present invention. This diagram is merely an example, which should not unduly limit the scope of the claims herein. One of ordinary skill in the art would recognize many variations, alternatives, and modifications. Like reference numerals are used in this figure as certain other figures herein. Such numbers are not intended to be limiting, however. As shown, the apparatus 700 is illuminating object 105 for selectively patterning a photosensitive material 101 overlying the object using the array of mirror devices 115. The objects include any suitable device such as semiconductor wafers, glass substrates. Preferably, one or more of the patterns are smaller (or even larger) based upon interference between first and second beams from mirror devices.

As noted, the apparatus has the array of mirror devices. Each of the mirror devices is capable of actuating from at least a first state to a second state. The first state can be an on state and the second state can be an off state. The first state exposes the photosensitive material 101, as shown. The second state keeps the photosensitive material from exposure and often reflects the illumination to a region outside the surface of the photosensitive material. Preferably, each of the mirror devices is associated with a pixel for a pattern to be exposed onto a photosensitive material. Preferably, the photosensitive material is the photoresist material, including positive and/or negative resists. Alternatively, certain regions are not exposed based upon the state of the mirror devices. Other ways of actuating the mirrors are described in more detail below.

As noted, patterns are derived from interference between at least first and second beams from respective mirror devices in the array. As shown, mirror device 721 reflects a first beam having a first wavelength from a surface of a first mirror device in an array of mirror devices toward pattern region 703. Mirror device 723 reflects a second beam having a second wavelength from a surface of a second mirror device in the array of mirror devices also toward the pattern region. The first beam is combined 701 with the second beam in a manner to form a resulting beam having a third wavelength. The third wavelength is smaller than both the first wavelength and the second wavelength. The resulting beam exposes a portion of photosensitive material in the pattern region 703. As shown, the third wavelength is smaller than either the first or second wavelength and forms a smaller pixel size than those provided by either first or second beam. The apparatus also includes mirror devices 727, 725, which include reflected beams. Such beams are combined 703 to expose pixel region 703. Depending upon the application, there can be many alternatives, variations, and alternatives.

In an alternative embodiment, the apparatus also combines beams to increase an intensity of the beams for a given pixel element. Here, a first mirror device reflects a first beam having a first intensity from a surface of the first mirror device toward a pattern region. A second mirror device reflects a second beam having a second intensity from a surface of the second mirror device to the pattern region. The method combines the first beam with the second beam in a manner to form a resulting beam having a third intensity, which is either smaller or larger than either the first intensity or the second intensity. Alternatively, the beams are combined before reflecting them from the mirror surfaces. The method exposes the pattern portion of photosensitive material overlying the object with the resulting beam having the third intensity, which could be larger or smaller than either beam. Depending upon the embodiment, there can be many other variations, modifications, and alternatives.

Figure 8:
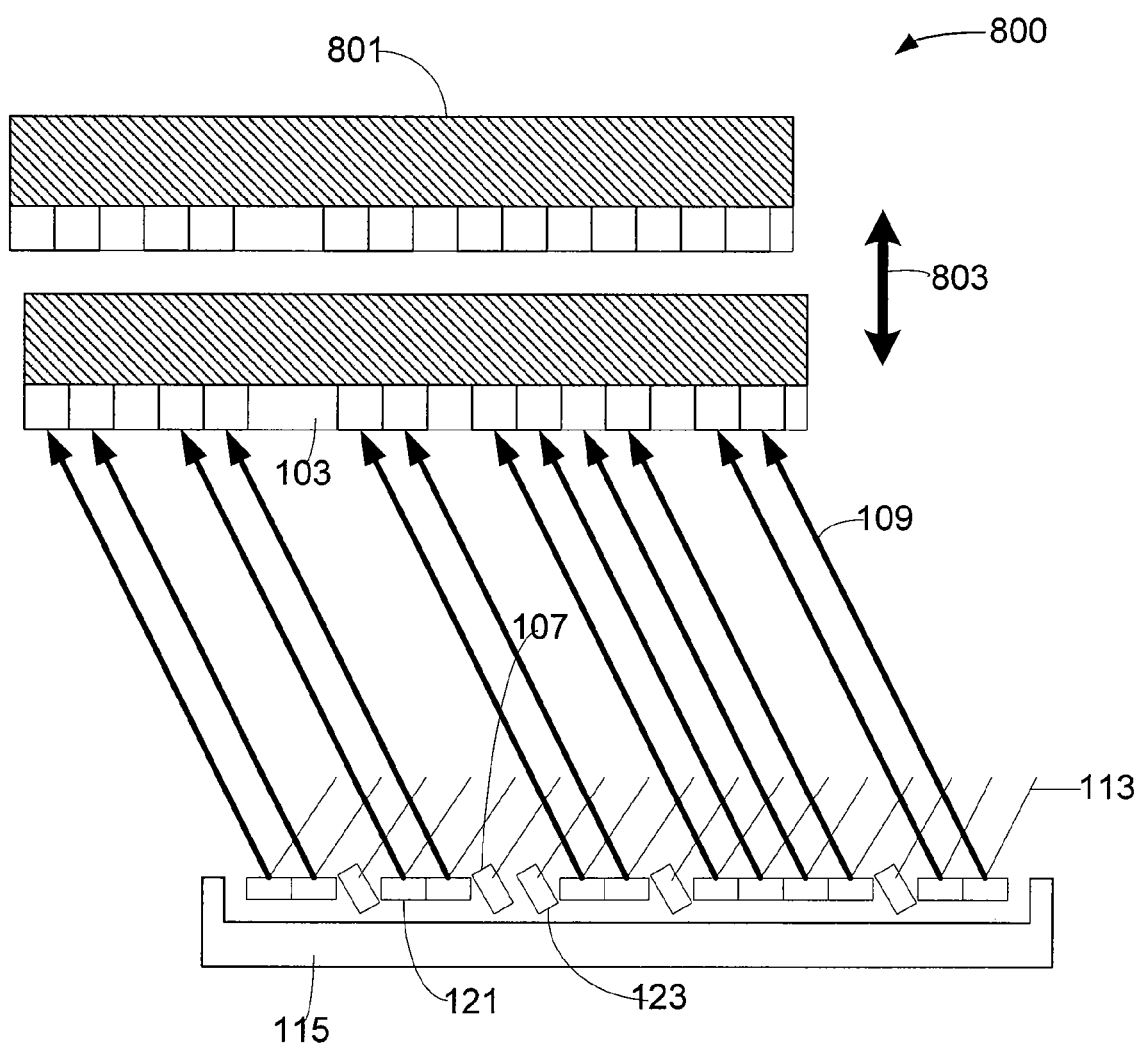
FIG. 8 is a simplified side-view diagram illustrating an optical patterning method according to an alternative embodiment of the present invention.

FIG. 8 is a simplified side-view diagram illustrating an optical patterning method according to an alternative embodiment of the present invention. This diagram is merely an example, which should not unduly limit the scope of the claims herein. One of ordinary skill in the art would recognize many variations, alternatives, and modifications. Again, like reference numerals are used in this figure as certain other figures herein. Such numbers are not intended to be limiting, however. As shown, the apparatus 800 is illuminating object 105 for selectively patterning a photosensitive material 101 overlying the object using the array of mirror devices 115. Preferably, one or more of the patterns are smaller based upon selective application of illumination using a spatial movement between the object and mirror device and timing of the beam output.

As noted, the apparatus has the array of mirror devices 121, 107, 123. Each of the mirror devices is capable of actuating from at least a first state 121 to a second state 107. The first state 121 can be an on-state and the second state 107 can be an off-state. The first state exposes the photosensitive material 101, as shown. The second state 103 keeps the photosensitive material from exposure and often reflects the illumination to a region outside the surface of the photosensitive material. Preferably, each of the mirror devices is associated with a pixel (e.g., 101) for a pattern to be exposed onto a photosensitive material. Preferably, the photosensitive material is the photoresist material, including positive and/or negative resists. Alternatively, certain regions 103 are not exposed based upon the state of the mirror devices.

Additionally, the apparatus has a drive mechanism to change the relative distance between the object and mirror devices. The drive mechanism can actuate the object to a second position 801, which is not to scale and shown for illustrative purposes only. The object can actuate through a range 803 of movement to change the distance between the object and mirror devices. Here, the movement modulates the beam that causes it to form an interference pattern, e.g., phase shift.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for illuminating an object for selectively patterning a photosensitive material overlying the object using an array of mirror devices, the method comprising:
    retrieving information associated with a pattern to be exposed onto the photosensitive material;
    determining outputs associated with one or more mirrors in an array of mirror devices to be actuated based on the information;
    applying electromagnetic radiation using a flood beam onto the array of mirror devices, each of the mirror devices being associated with a pixel for the pattern to be exposed onto the photosensitive material;
    selectively actuating one or more mirrors on the array to deflect corresponding portions of the beam onto corresponding portions of the photosensitive material to expose the portions of the photosensitive material on the object;
    maintaining one or more other mirrors in a selected position(s) to maintain corresponding other portions of the photosensitive material free from exposure by reflecting other portions of the beam to a region outside the surface of the photosensitive material, and
    adjusting a relative spatial distance between the array of mirrors and the photosensitive material for a predetermined period of time to shift a phase associated with at least one of the mirrors.

2. The method of claim 1 wherein the maintaining includes deflecting the one or more mirrors to the selected position(s).

3. The method of claim 1 wherein the selectively actuating the one or more mirrors in the array exposes selected portions of the photosensitive material to form the pattern.

4. The method of claim 1 wherein the selective actuating is provided by an electrostatic force.

5. The method of claim 1 wherein retrieving information is associated with retrieving a file from memory on a computer, the file including information associated with the pattern to be exposed onto the photosensitive material; reading the information in the file; and determining outputs associated with the selected one or more mirrors to be actuated.

6. The method of claim 1 wherein the mirror devices in the array form a complete set of pixels for any two dimensional pattern.

7. The method of claim 1 wherein the selectively actuating is provided before the application of electromagnetic radiation.

8. The method of claim 1 further comprising actuating a shutter between the object and the array of mirrors.

9. The method of claim 1 wherein the object is a semiconductor wafer or glass substrate.

10. The method of claim 1 wherein each of the mirrors is capable of deflecting a beam having a spot size of 0.1 to 0.4 microns and less.

11. An apparatus for illuminating an object for selectively patterning a photosensitive material overlying the object using an array of mirror devices, the apparatus comprising:
an array of mirror devices, each of the mirror devices being capable of actuating from at least a first state to a second state, each of the mirror devices being associated with a pixel for a pattern to be exposed onto a photosensitive material;
an electromagnetic radiation source coupled to the array of mirror devices, the electromagnetic radiation source being adapted to apply electromagnetic radiation using a flood beam onto the array of mirror devices;
a drive device coupled to the array of mirror devices, the drive device being configured to receive information associated with a pattern to be exposed onto the photosensitive material, the drive device being adapted to selectively actuate one or more mirrors on the array to deflect a portion of the beam onto a portion of the photosensitive material to expose the portion of the photosensitive material based on the information, and being adapted to maintain one or more other mirrors in a selected position for reflecting other portions of the beam outside of a surface region of the photosensitive material in order to maintain other portions of the photosensitive material free from exposure based on the information, and
wherein a relative spatial distance between the array of mirrors and the photosensitive material is adjustable for a predetermined period of time to shift a phase associated with at least one of the mirrors.

12. The apparatus of claim 11 wherein the drive device uses an electrostatic force to actuate the one or more mirrors in the array.

13. The apparatus of claim 11 further comprising a memory and a processor coupled to the drive device, the memory and the processor being adapted to retrieve a file from the memory, the file including information associated with the pattern to be exposed onto the photosensitive material, the memory and the processor being adapted to read the information in the file, the memory and the processor being adapted to determine the selected one or more mirrors to be actuated.

14. The apparatus of claim 11 wherein the mirror devices in the array forms a complete set of pixels associated with any pattern to be exposed onto the photosensitive material.

15. A reconfigurable mask comprising:
an array of deflection devices, each of the deflection devices being capable of actuating from at least a first state to a second state, each of the deflection devices being associated with a pixel for a pattern to be exposed onto a photosensitive material; and
a drive device coupled to the array of deflection devices, the drive device being adapted to selectively actuate one or more mirrors on the array to deflect a portion of a beam onto a portion of the photosensitive material to cause exposure of the portion of the photosensitive material based on the pattern, and being adapted to maintain one or more other mirrors in a selected position for reflecting other portions of the beam outside of a surface region of the photosensitive material in order to maintain other portions of the photosensitive material free from exposure based on the pattern, and
wherein a relative spatial distance between the array of deflection devices and the photosensitive material is adjustable for a predetermined period of time to shift a phase associated with at least one of the deflection devices.

* * * * *